(12) United States Patent  
Lim et al.

(10) Patent No.: US 8,486,757 B2
(45) Date of Patent: Jul. 16, 2013

(54) SEMICONDUCTOR DEVICE AND METHOD OF PACKAGING A SEMICONDUCTOR DEVICE WITH A CLIP

(75) Inventors: Boon Huat Lim, Johor (MY); Chee Chian Lim, Melaka (MY); Yoke Chin Goh, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 451 days.

(21) Appl. No.: 12/626,449

(22) Filed: Nov. 25, 2009

(65) Prior Publication Data

US 2011/0121461 A1   May 26, 2011

(51) Int. Cl.
*H01L 21/00* (2006.01)

(52) U.S. Cl.
USPC ........... 438/106; 438/110; 438/126; 438/113; 257/696; 257/692; 257/690; 257/685; 257/727

(58) Field of Classification Search
USPC .......... 257/690, 692, 696, 727, 685; 438/106, 438/110, 126, 113
See application file for complete search history.

(56) References Cited

U.S. PATENT DOCUMENTS

| | | | |
|---|---|---|---|
| 6,306,680 B1 | 10/2001 | Fillion et al. | |
| 2002/0066963 A1 | 6/2002 | Embong et al. | |
| 2003/0193080 A1 | 10/2003 | Cabahug et al. | |
| 2004/0063240 A1 | 4/2004 | Madrid et al. | |
| 2004/0065953 A1* | 4/2004 | Kato | 257/734 |
| 2005/0023658 A1 | 2/2005 | Tabira et al. | |
| 2005/0098871 A1 | 5/2005 | Fuergut et al. | |
| 2007/0114352 A1* | 5/2007 | Cruz et al. | 248/316.7 |
| 2007/0123073 A1* | 5/2007 | Xiaochun | 439/92 |
| 2007/0132091 A1 | 6/2007 | Wu et al. | |
| 2007/0145573 A1* | 6/2007 | Otremba | 257/718 |
| 2007/0215996 A1* | 9/2007 | Otremba | 257/678 |
| 2007/0290337 A1* | 12/2007 | Otremba et al. | 257/737 |
| 2008/0230928 A1* | 9/2008 | Otremba et al. | 257/784 |
| 2009/0108467 A1* | 4/2009 | Otremba | 257/777 |
| 2010/0072585 A1* | 3/2010 | Shi et al. | 257/669 |

FOREIGN PATENT DOCUMENTS

DE    102004037085    3/2005

* cited by examiner

*Primary Examiner* — Telly Green

(74) *Attorney, Agent, or Firm* — Dicke, Billig & Czaja, PLLC

(57) ABSTRACT

A method and apparatus of packaging a semiconductor device with a clip is disclosed. The clip defines a first contact region and a second contact region on a same face of the at least one clip. The chip defines a first face, and a second face opposite to the first face, the first contact region being attached to the first face of the chip and the second contact region being located within a same plane with the second face of the clip.

22 Claims, 7 Drawing Sheets

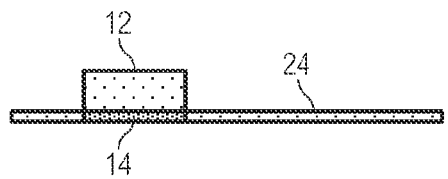
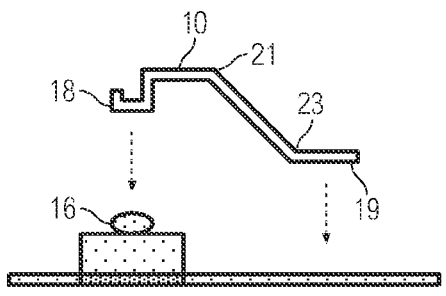
FIG. 1A  FIG. 1B
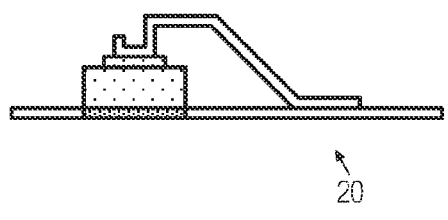
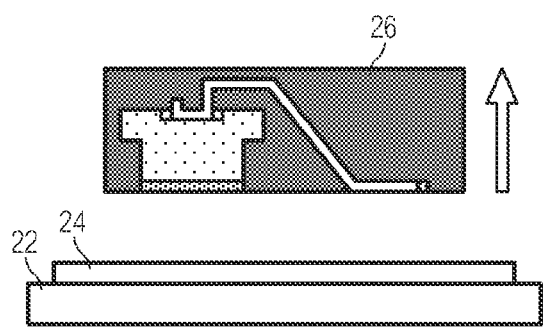
FIG. 1C  FIG. 1D
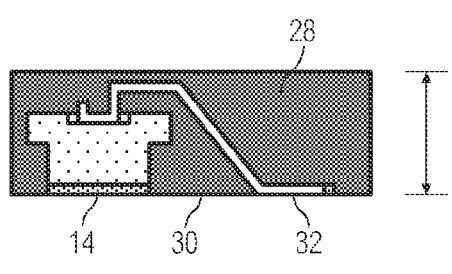
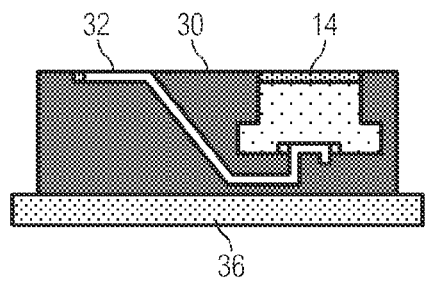
FIG. 1E  FIG. 1F

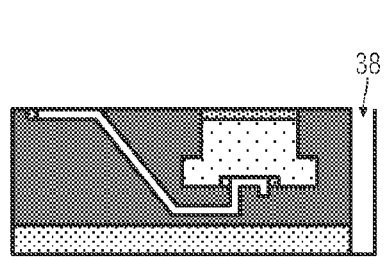
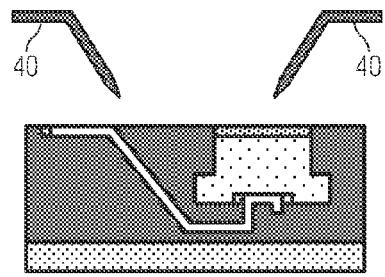
*FIG. 1G*  *FIG. 1H*
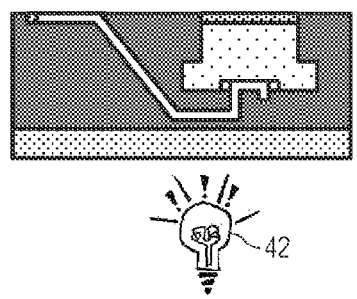
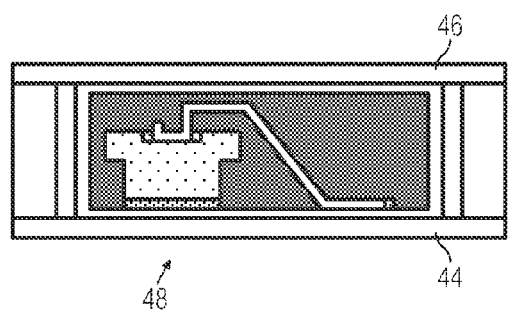
*FIG. 1L*  *FIG. 1J*
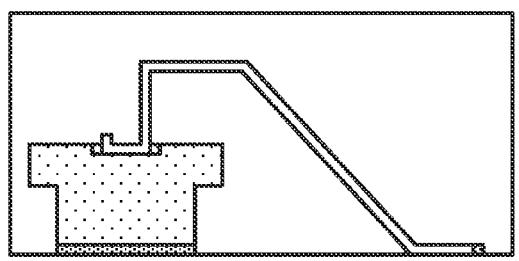
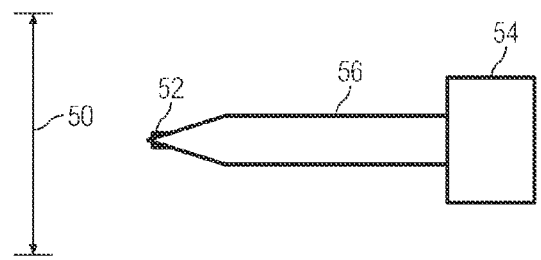
*FIG. 2A*  *FIG. 2B*

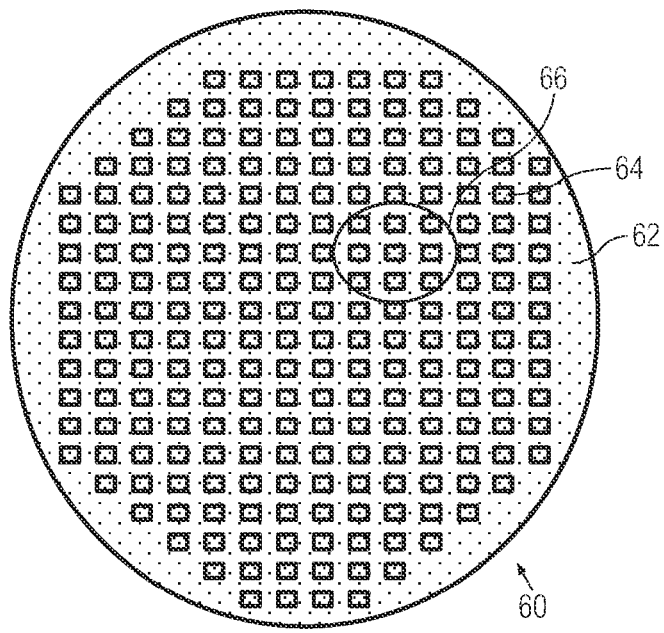
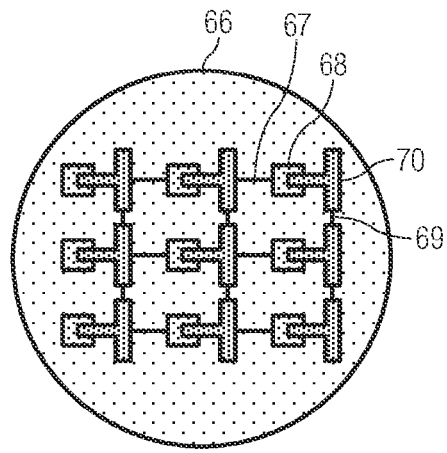
*FIG. 3A*   *FIG. 3B*
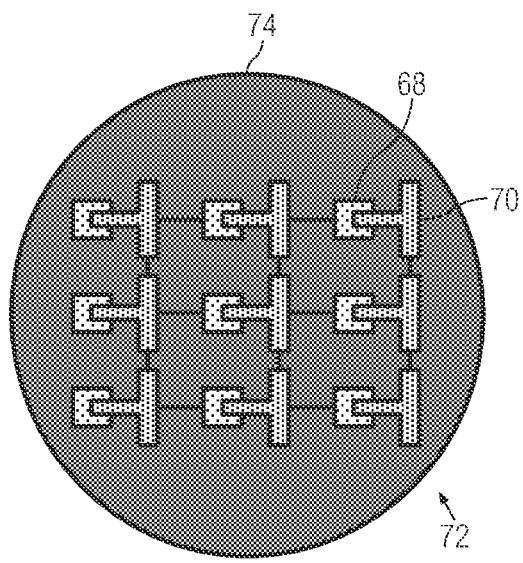
*FIG. 3C*

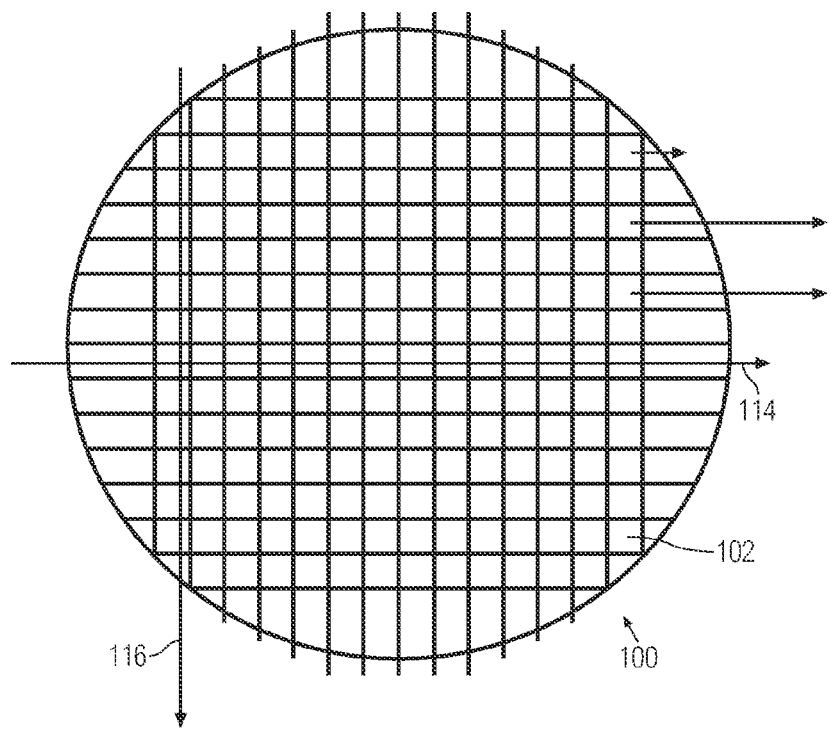
*FIG. 5A*
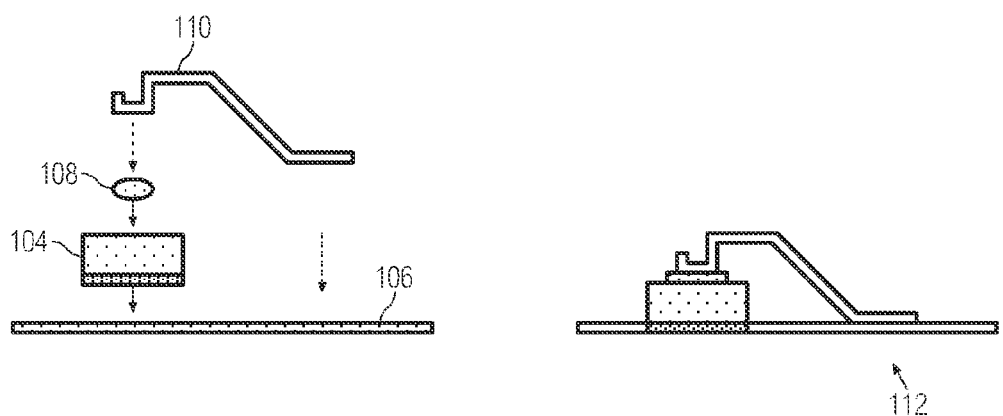
*FIG. 5B*   *FIG. 5C*

US 8,486,757 B2

SEMICONDUCTOR DEVICE AND METHOD OF PACKAGING A SEMICONDUCTOR DEVICE WITH A CLIP

FIELD OF THE INVENTION

This invention relates generally to a semiconductor device and method of packaging of a leadless semiconductor device, and in one embodiment to a semiconductor device and method of packaging of a leadless semiconductor device having a clip interconnect.

BACKGROUND

During packaging, semiconductor devices typically undergo a number of processing steps to form the complete semiconductor device. Such packaging steps usually include leadframe etching and metal bumping for placement of the semiconductor die placement. These steps are then typically followed by a high temperature die bonding and then a wire bonding process for electrically interconnecting the semiconductor device prior to the completing steps of molding, curing, dicing and curing.

These conventional steps and the typical components used in the packaging process contribute to the overall size and processing cost of the complete semiconductor device package. In particular during etching and metal bumping of the leadframe significant cost and time is incurred depending on the choice of leadframe and etching materials. The resulting metal bump height also contributes to the overall thickness of the semiconductor device. In the die bonding step, the process must be conducted in high temperatures, usually in the range of 300° C. to 430° C., which also contributes to the overall cost in the packaging process. Additionally, exposing the semiconductor device to such high processing temperatures during the package process may contribute to increasing the risk of processing imperfections of the complete semiconductor device. Wire bonding the die for providing electrical interconnects for the semiconductor device typically requires sufficient clearance for the wires above the die and contributes to a significant portion of the overall thickness of the semiconductor device package.

Attempts have been made to reduce the thickness of the die and limit the processing costs in the process steps of packaging semiconductor devices. However, such attempts have lead to other problems. For example, to reduce the overall thickness in conventional leadless design semiconductor devices based on leadframe configurations, limiting the thickness of the die makes the die brittle and makes the die susceptible to damage during die placement. Frequently, damage may include cracks in the die and the like that can result from high compression impact of the die on the leadframe during die placement. Additionally, the wire placement and interconnections formed in the wire bonding process may limit the electrical performance of the semiconductor device and may be a source of semiconductor device failure due to a faulty connection, wire misalignment or short. Such limitations or imperfections may make a finished leadless semiconductor device defective.

Therefore, there is a need for a method of packaging a semiconductor device and a semiconductor device that overcomes or at least alleviates the problems associated with conventional packaging processes of leadless semiconductor devices.

BRIEF DESCRIPTION OF THE DRAWINGS

In order that embodiments may be fully and more clearly understood by way of non-limitative examples, the following description is taken in conjunction with the accompanying drawings in which like reference numerals designate similar or corresponding elements, regions and portions, and in which:

FIG. 1A-1J illustrates a cross-sectional view of a semiconductor device during the process of packaging the semi-conductor device in accordance with an embodiment of the invention;

FIG. 2A-2B illustrate a cross-sectional view (FIG. 2A) and top perspective view (FIG. 2B) of a clip connector in accordance with an embodiment.

FIG. 3A-3D illustrates the expended wafer concept of an embodiment of the invention with a plan view of an expended wafer showing die to die spacing of a plurality of dies (FIG. 3A), a top plan view of a section of FIG. 3A in more detail showing the clip interconnect placement on the die tops (FIG. 3B), a the top plan view of FIG. 3B after wafer level molding (FIG. 3C), and a top cross-sectional view of FIG. 3C after wafer singulation in accordance with an embodiment.

FIG. 5A-5F illustrates the strip form concept of an embodiment of the invention with a plan view of an wafer without foil expansion showing X-Y direction die pick up for strip form processing of a plurality of dies (FIG. 5A), a top plan view of a section of FIG. 5A in more detail showing the clip interconnect placement on the die tops (FIG. 5B), the process of conductive phase screen printing in cross-sectional view (FIG. 5C), a cross-sectional view of the clip interconnect after processing illustrated in FIG. 5C (FIG. 5D), after molding (FIG. 5E), and after singulation (FIG. 5F) in accordance with an embodiment.

DETAILED DESCRIPTION

Figure 3D:
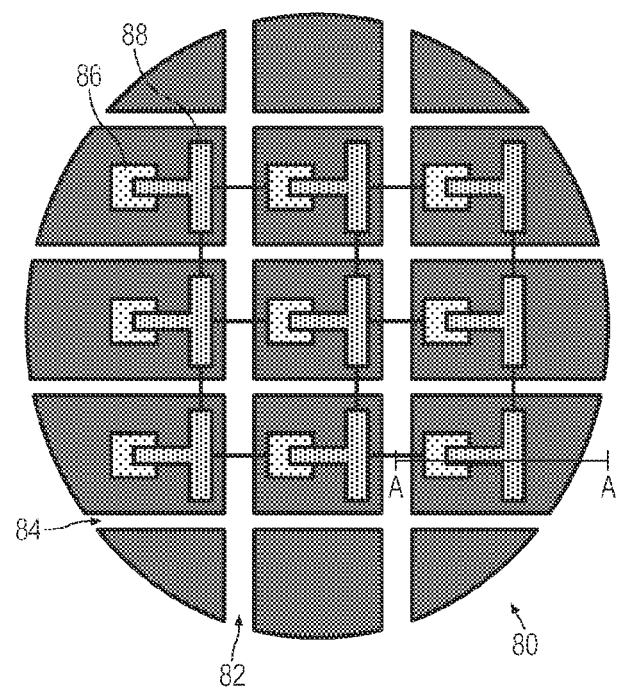

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a method of manufacturing a semiconductor device, including providing a chip, the chip having a first face and a second face opposite to the first face; providing at least one clip having first contact region and a second contact region on a same face of the at least one clip; attaching the first contact region of the at least one clip to the first face of the chip; encapsulating the chip and the at least one clip; and providing that the second contact region of the at least one clip is exposed after the encapsulation.

In one embodiment it is provided that the second face of the clip is exposed. The method may further comprise placing the second face of the chip onto the carrier. The second region of the at least one clip may be placed onto the carrier. In encapsulating the chip and the at least one chip may include placing the chip and the at least one clip placed into a molding unit. In encapsulating the chip and the at least one clip may include placing the chip and the at least one clip into a molding unit with the second face of the chip and the second region of the at least on clip placed on the carrier. The second contact region of the at least one clip is exposed may include keeping the second contact region exposed while encapsulating the chip and the at least one clip. The at least one clip may be mechanically biased so that the second region presses against the carrier after attachment of the first contact region of the at least one clip to the first face of the chip.

In one embodiment the chip may include at least one of an integrated circuit, a power transistor, a sensor, or the like. The chip may include a source contact of a transistor, or an emitter contact of a transistor, on the first face of the chip and a drain contact, or a collector contact, of the transistor on the second face of the chip. The first region of the at least one clip may be attached to the source contact, or the emitter contact, of the chip. The first region of a second one of the at least one of the clip may be attached to the gate or base of the chip.

In one embodiment, the first contact region of the at least one clip may be attached to the first face of the chip by at least one of soldering, welding, conductive epoxy or the like. The clips may be made from a metal sheet. The thickness of the metal sheet may be between for example 100 mm and 2000 mm depending on a particular application. Each of the clips is bent at least twice. The first contact region and the second contact region may be substantially coplanar. The clip may comprise a plurality of clips that are interconnected to form a clip interconnect mesh for a plurality of chips.

One embodiment provides a method for manufacturing multiple semiconductor devices, including providing an array of chips placed on a carrier; providing an array of clips, the clips being physically or mechanically connected with each other and each providing for a first contact region and a second contact region on a same face of the clip; attaching the first contact regions of the clips to the chips so that the second contact regions touch the carrier; encapsulating the array of chips and the array of clips; and disconnecting the connection between the clips after encapsulation.

One embodiment provides a semiconductor device, including a chip defining a first face, and a second face opposite to the first face; at least one clip defining a first contact region and a second contact region on a same face of the at least one clip, the first contact region being attached to the first face of the chip and the second contact region being located essentially within a same plane with the second face of the clip.

One embodiment provides a clip interconnect for a semiconductor device, including at least one clip defining a first contact region and a second contact region on a same face of the at least one clip, the chip defining a first face, and a second face opposite to the first face, the first contact region being attached to the first face of the chip and the second contact region being located substantially within a same plane with the second face of the clip.

A method of manufacturing a semiconductor device having a clip interconnect is disclosed. FIG. 1A-1J illustrates a cross-sectional view of a semiconductor device during the process of packaging the semi-conductor device in accordance with an embodiment of the invention. FIG. 1A illustrates a die 12 having a die pad 14 affixed to a temporary support such as an adhesive tape or foil 24.

FIG. 1B illustrates fixing of a clip interconnect 10 to the die 12. The clip interconnect is fixed to the die with a fixing means such as a conductive paste 16, which may be applied by epoxy screen print for example. The clip interconnect 10 may have a first contact region 18 for electrical contact with the conductive paste and the die. The clip interconnect 10 may have a second contact region for being exposed on the surface of the molding of the completed semiconductor package device. FIG. 1C illustrates the clip interconnect bonded and fixed to the die and adhered to the adhesive tape 24. The clip interconnect may be pre-plated copper (Cu), nickel (Ni), palladium (Pd), gold (Au) and the like.

The die and the clip interconnect are then molded with a molding compound 26, which may be powder molding, liquid molding or the like. The molding process may be performed with known techniques in the industry. FIG. 1D illustrates the die 12 and the clip connect encapsulated in the mold material 26. FIG. 1D illustrates that the molding material is removed from the adhesive tape 24 after the adhesive tape is provided on a temporary carrier 22. FIG. 1E illustrates that the first surface of the mold material 30 and second side of the mold material surface 28. The die pad 34 of the die 12 and the foot pin 32 of the clip interconnect 10 are exposed from the first surface 30 of the molding material 26. A lamination 36 is provided on the second surface 28 of the mold material 26 as illustrated in FIG. 1F in order to complete the processing. The final stages of the processing are illustrated as saw area 38 is illustrated in FIG. 1G and testing with testers 40 to check performance of the device is illustrated in FIG. 1H. Further processing such as radiators and UV lamps 42 is illustrated in FIG. 1I to fabricate the completed semiconductor device package 48 having a chip first face 44 and a chip second face 46 as illustrated in FIG. 1J. The clip interconnect may act not only as an interconnect, but may also act as input/output (I/O) lead or leads. For example the die back metal of the die and the foot print are acting as I/Os.

FIG. 2A illustrates a cross-sectional view of the die and clip interconnect to show the thickness of the semiconductor device package. The thickness achieved may be for example 0.2 mm. The thickness of the semiconductor device package may be arranged for a specific application. For example the clearance between the top of the clip interconnect to the surface of the mold material may only be approximately 50 µm for example, and from top of clip interconnect to top of die may only be approximately 100 µm for example. The overall thickness may only be for example 200 µm. FIG. 2B illustrates top perspective view of a clip connector in accordance with an embodiment of the invention. The clip connector has a tip 52, a base 54, and a connecting portion 56 between the tip and the base. Of course it will be appreciated that the configuration of the clip interconnect may be arranged with a different shape and profile. The configuration of the clip interconnect may be arranged for a particular application chip design, or the like. A mesh of clip interconnects may be configured and is described in further detail with respect to FIGS. 3B and 5D. The adjacent clip interconnects joined by connectors. The connectors may be of the same or different material than the material of the clip interconnects. The mesh of clip interconnects may be affixed to the plurality of dies with different fixing means and processes. For example, conductive paste may be used and applied by conductive paste screen printing. The conductive paste may be at room temperature. Other means of fixing the mesh of clip interconnects is possible, such as for example soldering, welding and the like. The cycle processing time of such a clip interconnect mesh is improved.

FIG. 3A-3D illustrates the expanded wafer concept of one embodiment of the invention. FIG. 3A illustrates a plan view 60 of an expended wafer showing die to die spacing of a plurality of dies 64 fixed on an adhesive tape or file 62. FIG. 3B illustrates a top plan view of a section 66 of FIG. 3A in more detail showing the clip interconnect mesh 76 placement on the die tops 68. The clip interconnect mesh 76 comprises connectors 67,69 between the clip interconnects from tip to adjacent foot print of adjacent clip interconnects and between the foot print to adjacent footprint of adjacent clip interconnects. FIG. 3C is a cross-sectional top view 72 of clip interconnect on top of die top of after wafer level molding with mold material 74. FIG. 3D illustrates a top plan view 80 of FIG. 3C after wafer singulation in accordance with an embodiment of the invention. The vertical singulation lines 82 and horizontal singulation lines 84 are illustrated with gaps between the dies 86 and corresponding clip connect 88. In this expanded tape wafer level concept, after singulation the expandable wafer tape, foil or the like is expanded to create the desired die to die spacing for the mesh clip interconnect and foot prints to be positioned on the empty die to die spacing area on the expanded adhesive tape.

The gaps are formed by expanding the adhesive tape or foil 62 illustrated in FIG. 3A after singulation. The foil may be stretched evenly to achieve the uniform gaps between the devices. Such a device to stretch the foil, tape adhesives or the like are known in the industry and is available, for example provided by Semiconductor Equipment Corporation of California, United States of America. The expandable foil, tape adhesives or the like may have high temperature characteristics to withstand temperatures during processing such as 200° C.

Figure 4A:
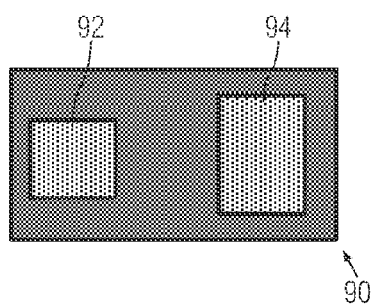
FIG. 4A-4B illustrate a bottom plan view of the view of a semiconductor device taken along line A-A of FIG. 4A (FIG. 4B), and a cross-sectional view of the semiconductor device with a clip interconnect taken along line B-B (FIG. 4C) in accordance with an embodiment.
Figure 4B:
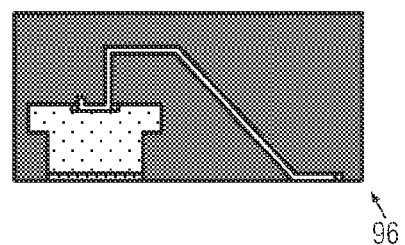

FIG. 4A is a bottom plan view of the view 90 of a semiconductor device in FIG. 3D showing the die bottom view and the clip interconnect bottom foot print view. FIG. 4B is a cross-sectional view 96 of taken along line A-A of a semiconductor device in FIG. 3D illustrating the die and clip interconnect encapsulated with mold material.

Figure 5D:
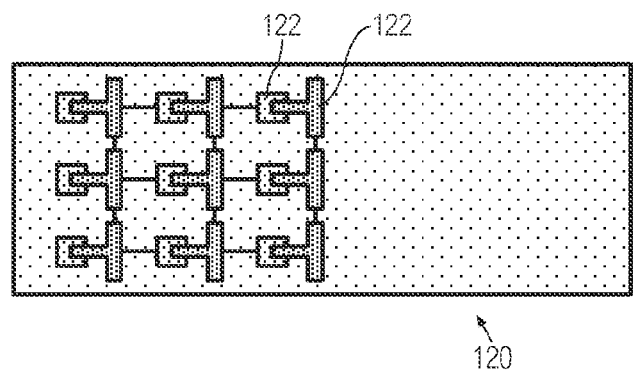
Figure 5E:
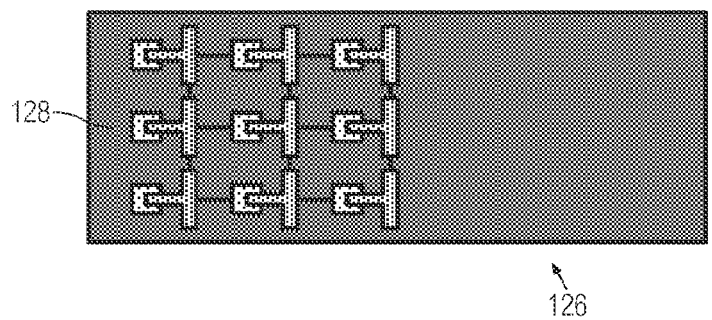
Figure 5F:
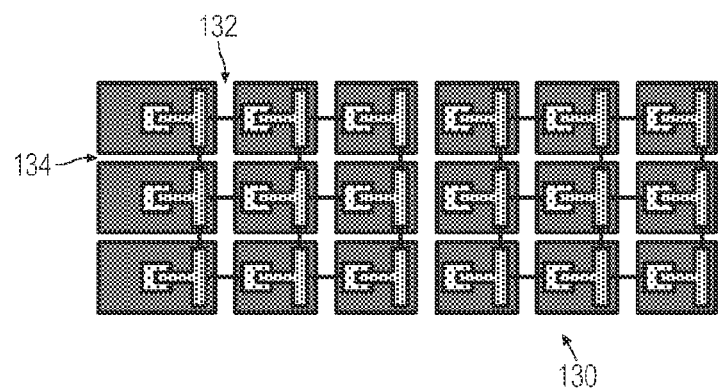

FIG. 5A-5F illustrates the strip form concept of an embodiment of the invention. FIG. 5A illustrates a plan view of a wafer without foil expansion showing X-Y direction 114,116 for row die pick up for strip form processing of a plurality of dies 102. For example a single row, or more than one row, may be picked up in the X and Y directions to create empty rows on the wafer level foil. The dies are picked up and attached to a support surface for further processing such as for example an adhesive tape, wafer or the like. FIG. 5B and FIG. 5C show in more detail the processing with respect to a die 104 and clip interconnect 110. The die is fixed or die bonded to the wafer substrate 106. The die bonding may be at room temperature. It will be appreciated that the die may be fixed to thermal resistance tape. The conductive paste 108 is applied to the die to fix the clip interconnect 110 to the die 104. The placement of the clip interconnect to the die of a single device 112 is illustrated in FIG. 5C, and the placement of the clip interconnect mesh 121 comprising a plurality of clip interconnects 124 to the plurality of dies 122 after conductive epoxy screen print is illustrated in the cross-sectional top view 120 in FIG. 5D. Similar views 126,130 are illustrated of the die and clip interconnect after molding in FIG. 5 E and after singulation in FIG. 5F. It will be appreciated that FIG. 5D-5F illustrate a strip form configuration of the tape foil, however, other forms, shapes and configurations can be envisaged. In the wafer level packaging concept described, the individual die pick up and die attached process is facilitated as conventional individual wire bonding interconnect processing is not required.

Figure 6:
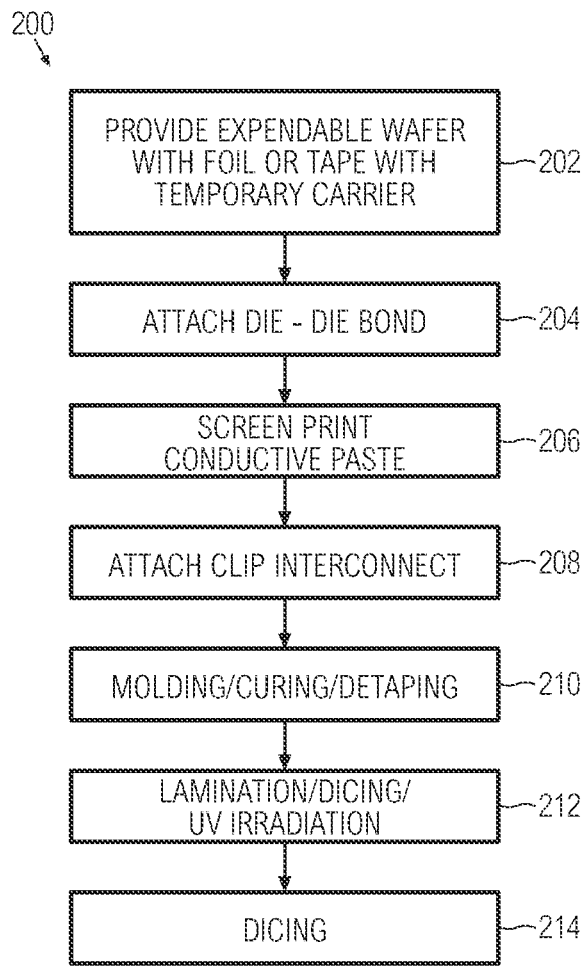
FIG. 6 is a flow chart illustrating a method of packaging a leadless semiconductor device having a clip interconnect in accordance with an embodiment.

FIG. 6 is a flow chart of a method 200 of packaging a leadless semiconductor device having a clip interconnect in accordance with one embodiment. The method may be with a single die and single clip interconnect or a plurality of clip interconnects formed in a mesh and affixed to a plurality of dies. An expandable wafer with foil or tape with a temporary carrier may be provided 202. The die is attached 204 to the tape or foil. The conductive paste is applied 206 such as by screen printing to the die and the clip interconnect or mesh of clip interconnects is attached 208 to the die. Further processing 210,212,214 such as molding curing and detaping and lamination, dicing and UV radiation, and dicing is performed to provide the completed semiconductor device package. After singulation, the foil or adhesive tape may be stretched to provide the adequate gaps required for further processing. In configurations with fixed non-expandable foil or adhesive tape, the dies may be positioned by pick and place on the wafer or adhesive tape with processes known in the industry.

With the methods and configurations discussed, improved quality in semiconductor processing is achieved over conventional applications using wafer back metal and Au bump. Process such as etch/Ni/Ag leadframe and high temperature die bonding and wire bonding are not necessary. Further procedures such as Cu-etching and Ni/Au deposition are similarly not required. Even vision process of inspection of completed semiconductor devices may be eliminated as quality is more certain with the clip interconnect device discussed. As materials such as Cu may be used instead of Au wire typically selected for wire bonding, the electrical performance is improved while costs may be minimized. The thickness of the overall package height is reduced as wire clearance is not required, the actual size of the die may be minimized, there is no leadframe Ni/Au bump height, and the like.

While embodiments of the invention have been described and illustrated, it will be understood by those skilled in the technology concerned that many variations or modifications in details of design or construction may be made without departing from the present invention.

The invention claimed is:

1. A method of manufacturing a semiconductor device, comprising:
   providing a chip, the chip having a first face and a second face opposite to the first face;
   providing at least one clip having first contact region and a second contact region on a first face of the at least one clip;
   attaching the first contact region of the at least one clip to the first face of the chip;
   encapsulating the chip and the at least one clip; and
   providing that the second contact region of the at least one clip is exposed after the encapsulation,
   wherein the second contact region is located substantially within a same plane with a die pad on the second face of the chip.

2. The method of claim 1 comprising providing that a second face of the at least one clip is exposed.

3. The method of claim 1 comprising placing a second face of the chip onto a carrier.

4. The method of claim 1 comprising placing the second contact region of the at least one clip onto a carrier.

5. The method of claim 1 wherein encapsulating the chip and the at least one clip includes placing the chip and the at least one clip placed into a molding unit.

6. The method of claim 1 wherein encapsulating the chip and the at least one clip includes placing the chip and the at least one clip into a molding unit with the second face of the chip and the second region of the at least one clip placed on a carrier.

7. The method of claim 1 wherein providing that the second contact region of the at least one clip is exposed includes keeping the second contact region exposed while encapsulating the chip and the at least one clip.

8. The method of claim 1 wherein the at least one clip is mechanically biased so that the second region presses against a carrier after attachment of the first contact region of the at least one clip to the first face of the chip.

9. The method of claim 1 wherein the chip comprises at least one of an integrated circuit, a power transistor, or a sensor.

10. The method of claim 1 wherein the chip comprises a source contact of a transistor, or an emitter contact of a transistor, on the first face of the chip, and a drain contact of a transistor, or a collector contact of the transistor, on the second face of the chip.

11. The method of claim 1 wherein the first region of the at least one clip is attached to a source contact of the chip, or an emitter contact of the chip.

12. The method of claim 1 wherein the first region of a second one of the at least one of the clip is attached to a gate of the chip, or a base of the chip.

13. The method of claim 1 wherein the first contact region of the at least one clip is attached to the first face of the chip by at least one of soldering, welding and conductive epoxy.

14. The method of claim 1 wherein the at least one clip is made from a metal sheet.

15. The method of claim 14 wherein a thickness of the metal sheet is between 100 mm and 500 mm.

16. The method of claim 1 wherein the at least one clip is bent at least twice.

17. The method of claim 1 wherein the first contact region and the second contact region are essentially coplanar.

18. The method of claim 1 wherein the at least one clip comprises a plurality of clips that are interconnected to form a clip interconnect mesh.

19. A method for manufacturing multiple semiconductor devices, comprising:
   providing an array of chips placed on a carrier;
   providing an array of clips, the clips being physically connected with each other and each providing for a first contact region and an opposing second contact region on a same face of the clip;
   attaching the first contact regions of at least one of the clips to each of the array of the chips so that the second contact regions of each of the respective clips touch the carrier;
   encapsulating the array of chips and the array of clips; and
   disconnecting the connection between the clips attached to different chips after encapsulation.

20. The method of claim 19 further comprises stretching the carrier for increasing the distance between adjacent chips of the array of chips.

21. The method of claim 19 further comprises encapsulating the chips and the clips.

22. The method of claim 19 wherein the first contact region and the second contact regions are essentially plane-parallel.

\* \* \* \* \*